Figure 1:
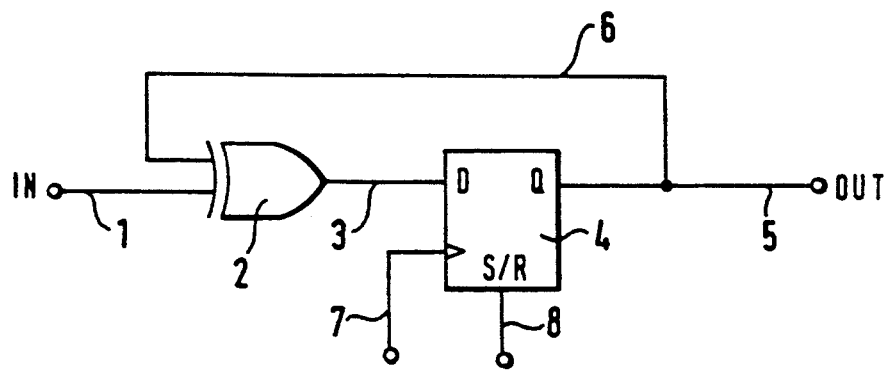

United States Patent [19]
Knoch

[11] Patent Number: 5,293,079
[45] Date of Patent: Mar. 8, 1994

[54] FORMATTER CIRCUIT

[75] Inventor: Ulrich Knoch, Gaertringen, Fed. Rep. of Germany

[73] Assignee: Hewlett-Packard Company, Palo Alto, Calif.

[21] Appl. No.: 964,772

[22] Filed: Oct. 22, 1992

[30] Foreign Application Priority Data

Nov. 11, 1991 [EP] European Pat. Off. ........ 91119190.6

[51] Int. Cl.$^5$ .............................................. H03K 5/13
[52] U.S. Cl. ..................................... 307/234; 328/111
[58] Field of Search ............... 307/303, 291, 471, 234; 328/110, 111

[56] References Cited

U.S. PATENT DOCUMENTS

| | | | |
|---|---|---|---|
| 3,670,249 | 6/1972 | Meslener | 328/110 |
| 3,906,378 | 9/1975 | Takahashi et al. | 328/110 |
| 4,001,611 | 1/1977 | Maruyama et al. | 307/291 |
| 4,002,933 | 1/1977 | Leuschner | 307/291 |
| 4,045,693 | 8/1977 | Ester | 307/291 |
| 4,267,514 | 5/1981 | Kimsey | 328/110 |
| 4,645,955 | 2/1987 | Ueno | 328/111 |
| 4,736,395 | 4/1988 | Sugihara | 307/291 |
| 4,891,028 | 1/1990 | Beltramini | 307/291 |
| 4,939,396 | 7/1990 | Schoettmer | 307/234 |
| 4,980,577 | 12/1990 | Baxter | 307/291 |
| 5,001,374 | 3/1991 | Chang | 328/111 |
| 5,015,874 | 5/1991 | Takatsu | 307/471 |
| 5,159,279 | 10/1992 | Shenoi et al. | 328/110 |
| 5,180,933 | 1/1993 | Krzyzanowski | 328/110 |

FOREIGN PATENT DOCUMENTS 0198677 10/1986 European Pat. Off. .

OTHER PUBLICATIONS

"Applied Ideas" Electronic Engineering, (1989) Jan., No. 745, Woolrich, London, Gr. Britain, pp. 23-24.

Primary Examiner—John T. Kwon
Attorney, Agent, or Firm—Perman & Green

[57] ABSTRACT

A formatter circuit for an integrated circuit tester comprises at least one edge-triggered toggle flip-flop, which may be constituted of an EXOR gate and a D flip-flop. This allows to build an event-driven formatter with broad flexibility and "change timing" capability. The basic toggle flip-flops may be cascaded by further EXOR gates, in order to perform more complex functions and to combine several data input signals or clock signals.

9 Claims, 5 Drawing Sheets

FORMATTER CIRCUIT

The present invention relates to a formatter circuit for an integrated circuit tester receiving
- at least one data signal, preferably from a memory,
- at least one timing signal, preferably from an edge generator, and providing at least one pulse sequence for appliance to at least one pin of a device under test.

The primary function of a formatter circuit as described herein is to link a data value (data) with a timing information (edge). The timing signal is preferably provided by an edge generator which allows very accurate control of the timing, in particular of the time of occurrence of an edge. For the details of an edge generator reference is made to European patent application 91119189.8 (Publication No. EP-A-541 839) which is hereby incorporated into the present disclosure by reference.

The data signal or data value determines the logical level of the output signal of the formatter, e.g. "0", "1" or "tri-state" (high impedance). The output of the formatter circuit is fed to one or more pins of the circuit to be tested (device under test=DUT), in order to have the DUT respond. The correct response of the DUT, and its correct timing, is then measured with a comparator circuit, as e.g. described in European patent EP-B-325 670. It is also possible to use more than one formatter circuit, one transmitting the logic state (e.g., "0" or "1"), another transmitting "tri-state" etc.

In prior art solutions, the integrated circuit testers used predefined data sequences, so-called "formats", for appliance to the formatter circuit. The prior art testers were able to support a limited number of formats such as "return to zero" (RTZ) or "return to complement" (RTC). As the formats were defined by the hardware layout of the tester, i.e. by interconnection of components, they could not be changed, and other formats than the prescribed ones were not supported.

The formatter circuits were adapted to this solution, i.e. the circuit layout of the formatters was such that they supported only the predefined formats of the integrated circuit tester. Two possible prior art solutions are e.g. discussed in European patent EP-B-329 798. According to the first solution, a flip-flop with Set/Reset inputs (SR flip-flop) receives two timing signals (preferably, from edge generators) to generate a pulse sequence for appliance to the DUT. The second solution provides D flip-flops with their $\bar{Q}$ outputs fed back to their D input such that they operate as frequency dividers. These flip-flops are "free-running", i.e. their output signal is only dependent on the clock signal (received from edge generators) and not of any data information, i.e. the format information. As FIG. 5 of EP-B-329 798 depicts, multiplexers have to be used to link or connect the data value (e.g. the "format data" signal or the "formatter control" signal) with the output signal of the D flip-flops.

Prior art formatters used one of the above solutions, i.e. either to set and reset a flip-flop, or to have a flip-flop invert its former content. These solutions worked quite well as long as only a limited number of predefined formats had to be supported.

However, as the circuits to be tested are becoming more and more complex (e.g. the latest microprocessors, reduced instruction set CPU's and their peripherals), the need arises for more sophisticated integrated circuit testers which are able to support more formats, and even formats which are not yet known at the time when the tester is manufactured. Further, there may be very special integrated circuits for which the user should be able to define his own formats or timing. Due to the hardware limitation, such features cannot be supported by prior art formatter circuits.

Another disadvantage of the prior art formatter circuits is that they cannot change the format between single clock cycles, i.e. "on the fly". Instead, interrupts or break cycles are required to switch from one format to another. This is a severe limitation, as not only the overall testing time is extended, but also integrated circuits with a quite tight timing cannot be completely and reliably tested. Yet another problem of prior art formatters is their limited data rate, which in turn limits its operating speed. Major reasons for this limitation are:

a) the set-up and hold times of a Set/Reset flip-flop (which is even used—in the last stage—in the solution with a frequency-divider D flip-flop) limit the minimum possible pulse width and also data throughput;

b) formats using a complement like "return to complement" (RTC) require a feedback loop which, in turn, limits the minimum pulse width and the possible data throughput as well.

Last not least, it is difficult to expand the prior art formatters such that they can process more clock signals, i.e. edges from a multiplicity of edge generators, as this impacts the data rate as well. Still the most severe limitation is that, as the predefined formats are "frozen" in hardware components, no adaptation is possible.

It is therefore major objective of the present invention to provide a formatter circuit for integrated circuit testers with the required flexibility, in particular flexibility of the used formats.

According to one aspect of the invention, this object is solved, in a formatter circuit of the kind described above, by at least one, preferably edge-triggered, toggle flip-flop, wherein the timing signal is fed to a clock input of the toggle flip-flop and the data signal is fed to a data input of the toggle flip-flop.

In general, the toggle flip-flop, also sometimes referred to as T flip-flop, changes its state from clock cycle to clock cycle as long as the data input is "true", i.e. usually logical "1". That is, its output is inverted from clock cycle to clock cycle. On the other hand, if the data input becomes "false"—usually, logical "0"—, then the flip-flop stops its toggle operation and holds its output until the data input becomes "true" again. In order to increase operating speed and to ensure the correct logical levels even at very fast transitions, the T flip-flop is an edge-triggered flip-flop.

The present invention implements a new formatter concept. Prior art formatters used to link the timing signal with the data signal. In contrast thereto, the formatter according to the present invention links the *changes* of the data signal with the timing signal. In other words, the inventive formatter circuit uses the *transitions* of the data signal instead of its *state* (as prior art formatters did). The new formatter can therefore also be designated as an "event driven formatter", in contrast to the prior art "state driven formatters".

The new formatter concept has particularly the following major advantages:

1. It supports any arbitrary number of formats, whether predefined or not, and is not restricted to a limited number of predefined formats;

2. the circuit layout may be expanded to any number of clocks (edges), without any negative impact on operating speed;
3. the data rate is considerably increased as no further feedback from the output of the formatter to its input is necessary;
4. the formats may be changed from clock cycle to clock cycle ("change timing on the fly");
5. slow flip-flops may operate at low frequencies;
6. the minimum difference of timing signals is only limited by the minimum pulse width possible with the used technology, which is in turn determined by the (very small) rise and fall times of gates succeeding the toggle flip-flops, but not by set-up and hold times of flip-flops in the succeeding stage (see discussion below).

In an advantageous embodiment of the present invention, the controllable flip-flop comprises an edge-triggered D flip-flop with the output of an EXOR or EXOR-like circuit, preferably an EXOR gate, connected to its D-input and its output fed back to one input of the EXOR circuit, whereas the other input of the EXOR circuit receives the data signal. In other words, the data signal is fed to one input of an EXOR gate whose output is connected with the D input of the edge-triggered D flip-flop. The Q output of the D flip-flop is fed back to the second input of the EXOR gate. As long as the data signal is "0", the EXOR gate "transmits" the output signal of the D flip-flop to its D-input, so that it does not change its state upon the occurrence of an active edge at its clock input. If the data input is "1", the EXOR gate inverts the output signal of the D flip-flop, such that it changes its state upon every active edge. It is understood that the EXOR circuit may not only be implemented in the form of a discrete or integrated EXOR gate, but also by means of other gates implementing the corresponding antivalence function, namely $$y = x_1 \cdot \overline{x_2} + \overline{x_1} \cdot x_2 \quad (1)$$

wherein $x_1$ and $x_2$ indicate the inputs, and $y$ indicates the output of the antivalence circuit. For example, equation (1) can be reformulated as follows:

$$y = \overline{\overline{x_1} + x_2} + \overline{x_1 + \overline{x_2}} \quad (2)$$

which may be implemented by means of two inverters, two NOR gates and one OR gate. Similar considerations apply if the logical level is reversed, i.e. "1" corresponds to "false" and "0" corresponds to "true".

In another example, equation (1) may be rewritten as follows:

$$y = \overline{\overline{x_1} \cdot x_2} + \overline{x_1 \cdot x_2} \quad (3)$$

It will be noted that, if not the Q output of the flip-flop is used, but rather its $\overline{Q}$ output (which produces $x_1$ instead of $x_1$), this is exactly the equation of an equivalence function. Therefore, the term "EXOR-like circuit" covers such an equivalence function as well. Other reformulations of equation (1) are possible as well.

In order to have predefined starting conditions of the formatter, it will be useful to provide a Set input or a Reset input of the D flip-flop.

Preferably, the D flip-flop is a single-stage flip-flop, i.e. triggers on one edge (either the positive or the negative edge) of the clock signal only, and its output follows instantaneously—only delayed by the propagation delay time—a transition of the clock signal.

However, it will be understood that two-stage flip-flops like master-slave flip-flops, and flip-flops other than D flip-flops may be used to practice the present invention as well. For example, in an advantageous embodiment of the present invention, a JK flip-flop is used, wherein the data signal is directly or indirectly fed to the J as well as the K input of the JK flip-flop. If the flip-flop comprises separate Set and/or Reset inputs, the data signal may be directly fed to the J and the K input, whereas, if no separate Set and/or Reset inputs are provided, additional circuitry is required.

The truth table of a JK flip-flop is as follows:

| $J^n$ | $K^n$ | $Q^{n+1}$ | (4) |
|---|---|---|---|
| 0 | 0 | $Q^n$ | |
| 0 | 1 | 0 | |
| 1 | 0 | 1 | |
| 1 | 1 | $\overline{Q^n}$ | | wherein $J^n$ indicates the J input at time n, $K^n$ indicates the K input at time n, $\overline{Q^n}$ indicates the Q output at time n, $Q^n$ indicates the inverted Q output at time n, and $Q^{n+1}$ indicates the Q output at time (n+1). It will be noted that, if the J and K inputs are tied together—as proposed above—, this truth table is simplified as follows:

| $J^n = K^n$ | $Q^{n+1}$ | (5) |
|---|---|---|
| 0 | $Q^n$ | |
| 1 | $\overline{Q^n}$ | |

This is exactly the required operation of a T flip-flop which holds its output as long as the input is "0" and toggles as long as the input is "1".

It will be appreciated that other common flip-flops may be used to implement a T flip-flop with the required functionality as well.

In more sophisticated applications, it may be necessary to combine more than one data signal in the formatter circuit, in order to provide more complex functions. The design with an edge-triggered toggle flip-flop as proposed by the present invention is ideally suited to be stacked or cascaded, in order to process this multiplicity of data signals. In a preferred embodiment, the invention provides at least two (preferably, a multiplicity of) toggle flip-flops with their outputs fed to the inputs of an EXOR or EXOR-like circuitry. The EXOR circuitry may consist of various EXOR gates or gates implementing an EXOR function or an equivalent thereof (e.g., by means of an equivalence function, as discussed above), and, if required, of other gates as well. In such an interconnection scheme, it is not only possible to combine different data signals by feeding them to the various toggle flip-flops, but these toggle flip-flops may also receive different timing signals (e.g. from different edge generators), such that a more complex timing structure is possible. The latter feature—timing signals from different edge generators which are fed to different toggle flip-flops—allows particularly an extremely flexible timing.

The above interconnection scheme allows particularly short pulse widths, as the EXOR gates, or like gate circuitry, require only very small rise and fall times and not the considerably longer set-up and hold times of a flip-flop, as used in prior art designs.

In a preferred embodiment, at least two levels of EXOR circuits, preferably EXOR gates, are provided. The outputs of the toggle flip-flops are connected with the inputs of the EXOR circuits of the first level, and at least some of the outputs of the EXOR circuits of the first level are connected with the inputs of the EXOR gates of the second level. This results in a cascaded structure wherein every change of a flip-flop output results in a corresponding change of the overall output signal. The EXOR interconnection can also be characterized as "controllable inversion". It will be noted that the above described advantage of short minimum pulse widths is particularly obtained if a multi-level output EXOR circuitry is used, as this avoids the need for several subsequent flip-flops with the associated set-up and hold times.

Due to the above advantages, the concept of toggle flip-flops with subsequent EXOR-like circuitry may even be expanded to other applications where various input signals have to be combined to a single signal. Therefore, the present invention also relates to a data combining circuit which is characterized by
  at least two toggle flip-flops, wherein each toggle flip-flop receives
    at least one data signal and
    at least one timing signal,
  at least one EXOR or EXOR-like circuitry, preferably an EXOR gate,
  the outputs of said at least two toggle flip-flops being fed to the inputs of said EXOR or EXOR-like circuitry.

Such a data combining circuit may e.g. be used as a fast multiplexer for data transmission or communication lines, or like applications.

It is understood that this cascaded EXOR structure mentioned above may be expanded to more than two levels as well, in particular if more than four toggle flip-flops are provided. An example with three levels will be discussed in the detailed description. If more than two levels of EXOR circuits are provided, it may also be advantageous to connect the output of at least one EXOR circuit of a lower level directly with the input of an EXOR gate which is at least two levels higher.

Other interconnection circuits than the above described EXOR interconnection may be used to combine the outputs of a multiplicity of toggle flip-flops as well.

In another advantageous embodiment of the present invention, said toggle flip-flop(s) comprise(s) differential inputs and/or outputs. That is, the flip-flops receive not only the data signal and the timing signal, but also their complements, in order to provide fast and symmetric processing. The outputs of the flip-flop may also be differential, i.e. provide a Q and a $\bar{Q}$ output. Likewise, the EXOR gates may comprise differential inputs and/or outputs. The feature of differential inputs and/or outputs generally increases the operating speed and ensures reliable operation, which is an important feature in a high-speed, high-performance integrated circuit tester.

The formatter circuit according to the present invention is particularly suited to generate pulse sequences of any desired timing and/or shape. In order to make full use of the resources provided by the formatter, it is advantageous to provide a memory which fully supports free definition of formats and "change timing on the fly"/"change format on the fly". Therefore, in an advantageous embodiment of the invention, said memory is a waveform memory containing waveform data and operating under control of a vector memory. The vector memory defines the states and transitions to occur in the output pulse sequence, and the waveform memory decodes the contents of the vector memory into control signals for the toggle flip-flops. For this purpose, address signals generated by a sequencer are fed to the address inputs of the vector memory, and the data outputs of the vector memory are, in turn, connected with the address inputs of the waveform memory, and that data outputs of the waveform memory constitute the control signals or data signals fed to the toggle flip-flops. Preferably, the waveform memory is re-programmable, such that waveforms or actions of any kind may be defined by the user. For more details of the vector memory/waveform memory concept, reference is made to the above-mentioned European patent application 91119189.8 (Publication No. EP-A-541 839).

The present invention also relates to a method for formatting data in an integrated circuit tester, wherein a data signal is fed to a data input of a (preferably edge-triggered) toggle flip-flop and a timing signal is fed to a clock input of the edge-triggered toggle flip-flop.

More features and advantages of the present invention will be apparent from the following detailed description.

Figure 2:
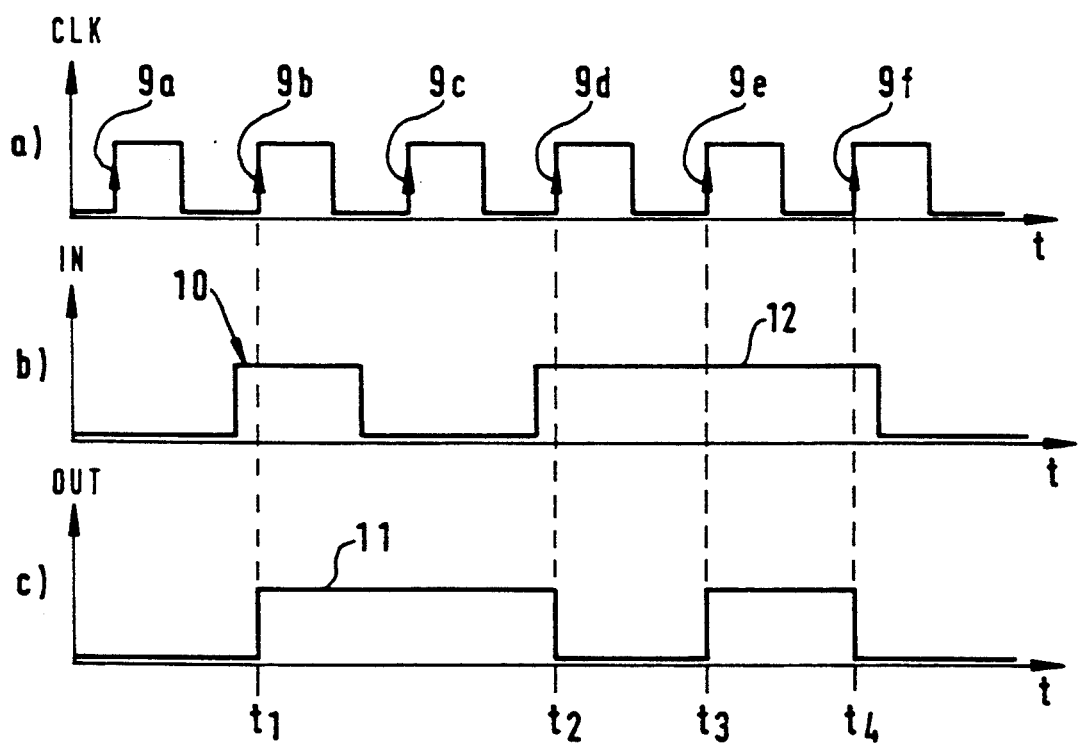
Figure 3:
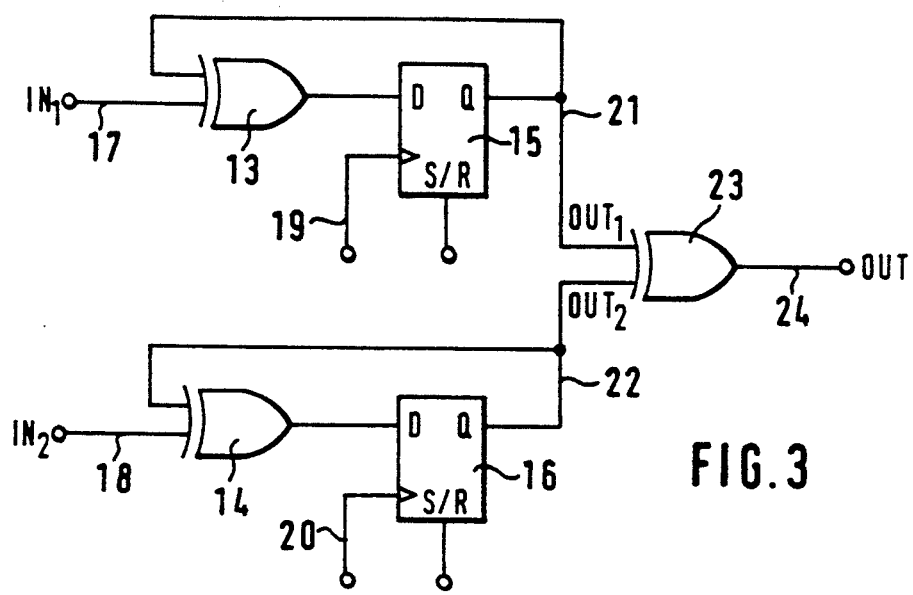
Figure 4:
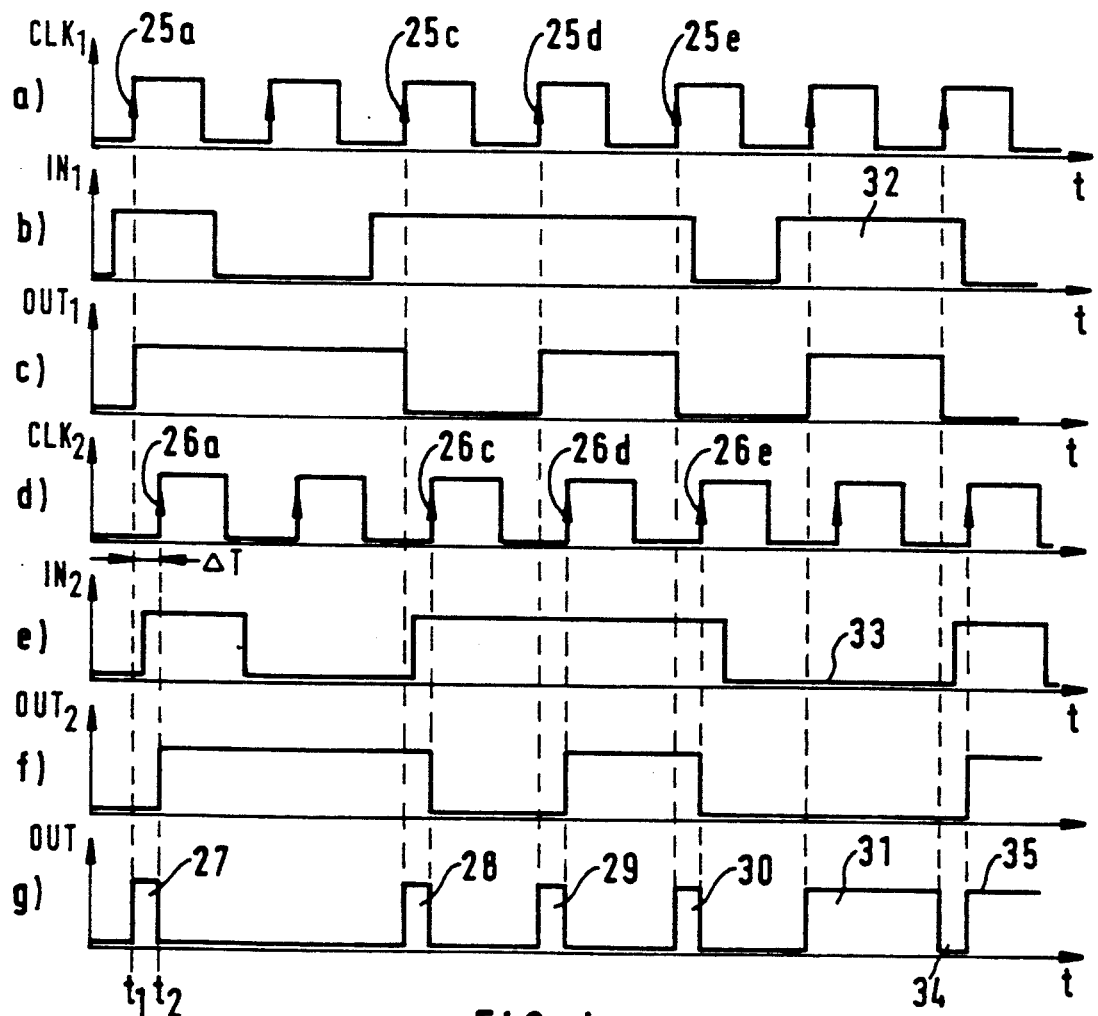
Figure 5:
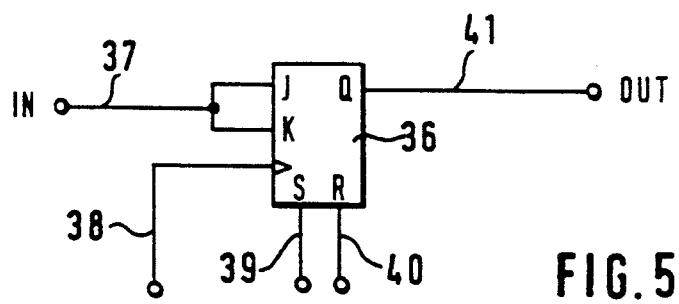
Figure 6:
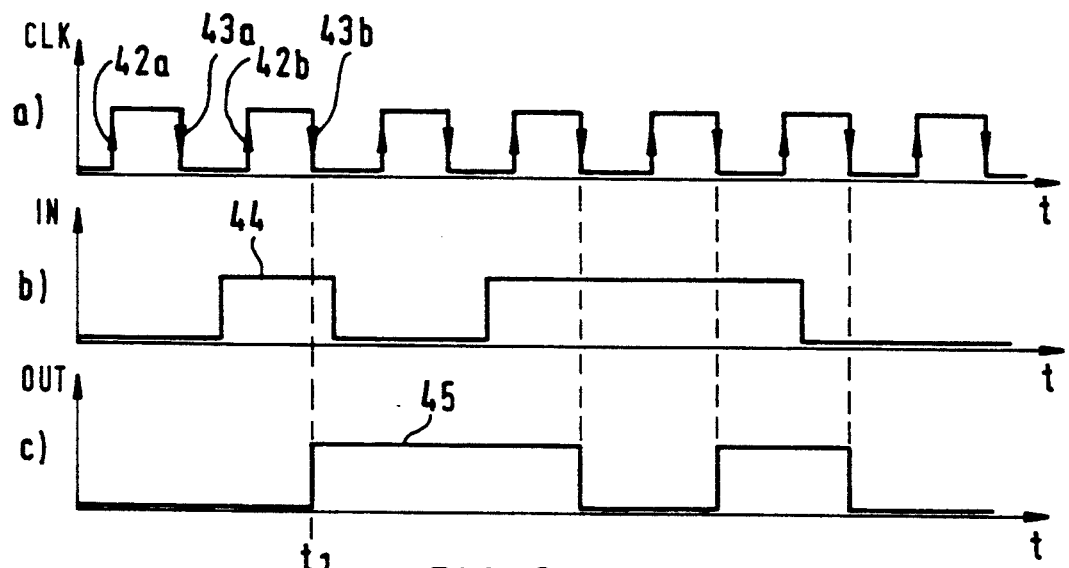
Figure 7:
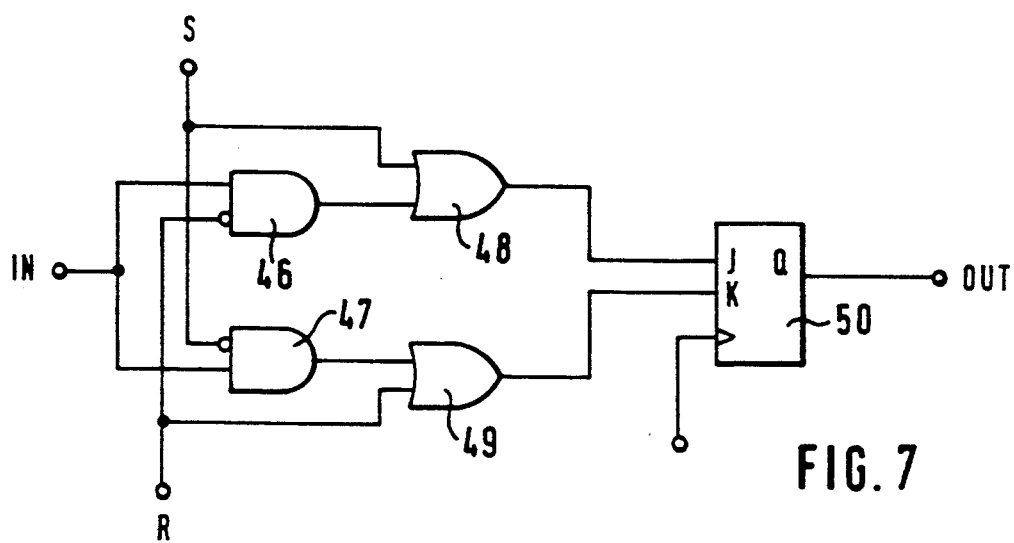
Figure 8:
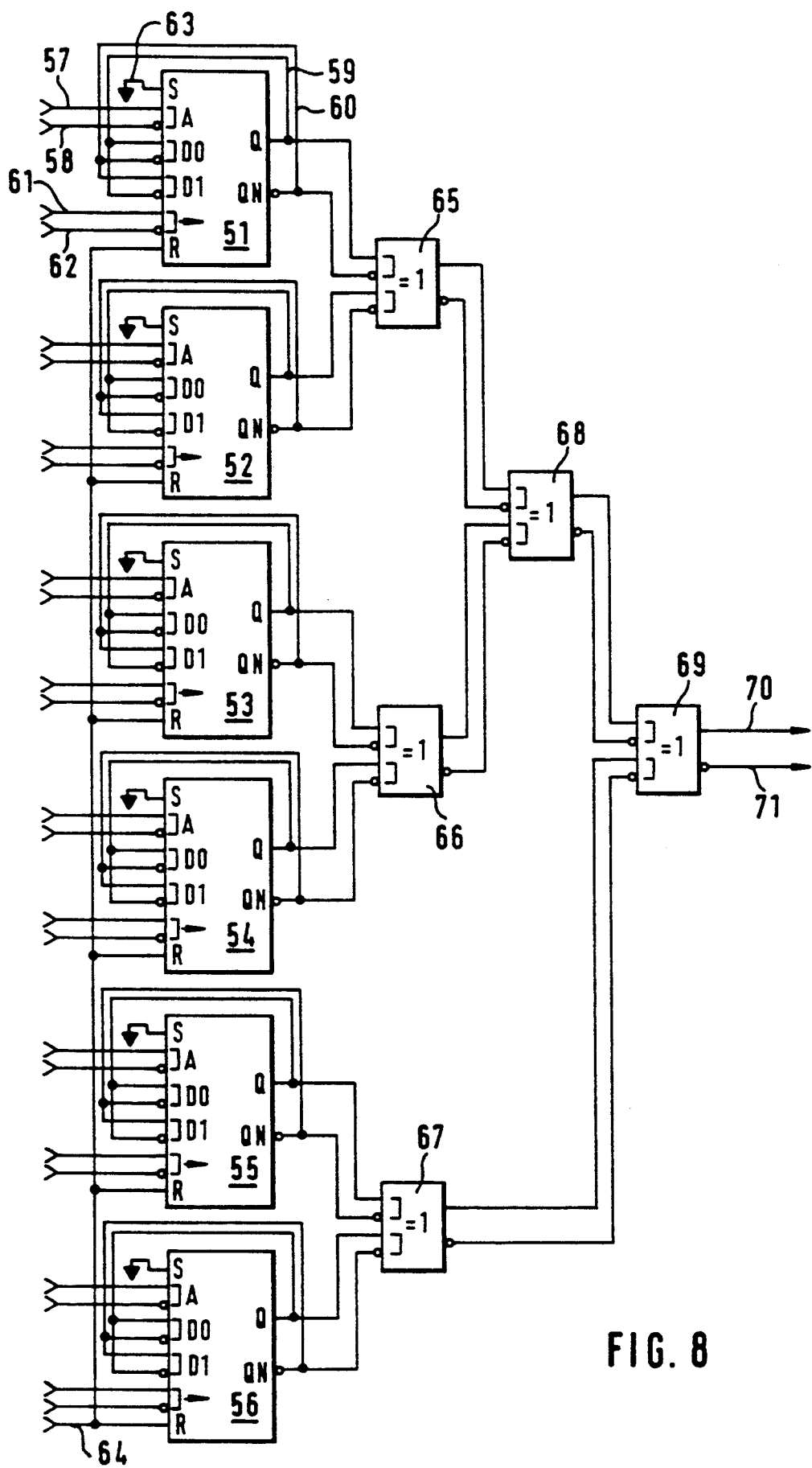
Figure 9:
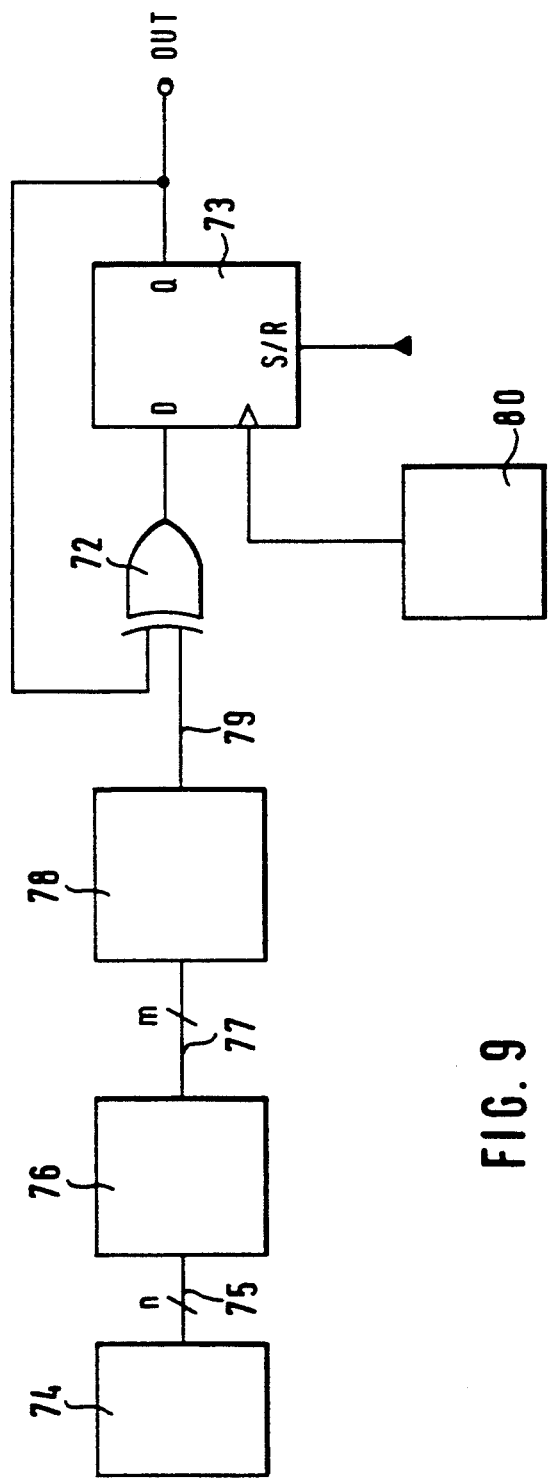

The invention will now be explained, by means of a non-limiting example, with reference to the accompanying drawings, in which:

FIG. 1 depicts the basic design (basic cell) of a formatter circuit according to the present invention, FIG. 2 is the timing diagram of the circuit in FIG. 1, FIG. 3 shows a more sophisticated environment of the inventive formatter incorporating two basic cells, FIG. 4 is the timing diagram for the circuit of FIG. 3, FIG. 5 depicts an alternate basic circuit using a JK flip-flop instead of a D flip-flop, FIG. 6 is the timing diagram of the circuit of FIG. 5, FIG. 7 shows a circuit with a JK flip-flop with no separate Set/Reset inputs, FIG. 8 depicts a formatter circuit with six integrated toggle flip-flops with differential design and the associated EXOR combination logic, and FIG. 9 depicts the basic control elements of a formatter circuit according to the present invention.

In the circuit of FIG. 1, a data signal is fed to the "IN" input 1 of an EXOR gate 2. The output of this EXOR gate is connected—via line 3—with the D input of a one-stage D flip-flop 4. The Q output of this flip-flop constitutes the pulse sequence fed to a pin of a device under test via line 5 (signal "OUT"), and is further fed back to the second input of EXOR gate 2 via line 6. The signal of an edge generator (not shown in FIG. 1) is fed, via line 7, to the clock input of D flip-flop 4; likewise, a signal on line 8 is fed to a "set" or a "reset" input of the D flip-flop.

The circuit of FIG. 1 constitutes an event-driven formatter basically implemented by means of a controllable toggle flip-flop. Its operation will now be explained with reference to FIG. 2, wherein FIG. 2a depicts the clock signal (CLK) applied to the clock input of D flip-flop 4 on line 7, FIG. 2b indicates the data signal IN on line 1, and FIG. 2c represents output signal OUT on line 5.

As D flip-flop 4 is a one-stage flip-flop, i.e. the signal at its data input D appears quasi-instantaneously after the occurrence of a transition of the clock signal at its output (delayed only by the propagation delay time of the flip-flop), only the transitions from "0" to "1" of the clock signal are useful or "active" edges. One of these active edges or "positive transitions" has been labelled as 9a in FIG. 2a. In the timing diagram of FIG. 2c, it has been assumed that the Q output of the flip-flop has been originally 0.

As long as the input signal (FIG. 2b) equals 0, the Q output of the D flip-flop holds its output state. Even the occurrence of a "1" level on input line 1 (reference number 10) does not effect the state of the flip-flop, as long as no positive transition of the clock signal occurs.

At $t=t_1$, the clock signal shows an active edge 9b. This causes D flip-flop 4 to change its output state to "1", as indicated by reference number 11.

When the next active edge 9c of the clock signal occurs, the input signal (FIG. 2b) has already returned to 0, so that the output of D flip-flop 4 holds its "1" state.

Reference number 12 indicates a "1" state of the input signal which covers three active edges 9d, 9e and 9f of the clock signal. At every of these active edges, namely at $t=t_2$, $t=t_3$ and $t=t_4$, T flip-flop 4 changes its output state, i.e. toggles.

FIG. 2 thus illustrates that the basic cell shown in FIG. 1 holds its output state as long as the input data signal IN is "0", and toggles as long as the input signal is "1". This is the desired function of an event-driven formatter controlled by the signal on input line 1.

FIG. 3 shows a more sophisticated environment of a formatter circuit according to the present invention incorporating two basic cells as shown in FIG. 1. It will be noted that the basic circuit layout of EXOR gates 13 and 14 and D flip-flops 15 and 16 is the same as the circuit layout of the formatter shown in FIG. 1. However, the two basic cells receive different data signals $IN_1$ and $IN_2$ on data input lines 17 and 18. Likewise, they receive different clock signals (hereinafter denoted as $CLK_1$ and $CLK_2$) on their respective clock input lines 19 and 20. Their two outputs $OUT_1$ and $OUT_2$ (lines 21 and 22) are fed to the inputs of an additional EXOR gate 23, the output of which constitutes the pulse sequence OUT to be applied to a pin of the device under test (line 24).

The corresponding timing diagram is shown in FIG. 4. FIGS. 4a–4c depict the clock signal $CLK_1$ fed to the clock input of the first D flip-flop 15 on line 19, its input signal $IN_1$ on line 17 and its output $OUT_1$, respectively. In similar manner, FIGS. 4d–4f illustrate the clock signal, the input signal and the output signal of the second basic cell constituted by EXOR gate 14 and D flip-flop 16. FIG. 4g depicts the combined output signal OUT on line 24, i.e. the output of EXOR gate 23.

It will be noted that the two clock signals $CLK_1$ and $CLK_2$ are shifted in time with respect to each other by an amount $\Delta T$. Active edges 25a and 26a of clock signals $CLK_1$ and $CLK_2$ cause corresponding state changes in the Q outputs of their respective flip-flops, such that a short output pulse 27 between $t=t_1$ and $t=t_2$ is generated. This illustrates that, in fact, every state change of an input signal results in a corresponding change in the overall output signal OUT.

The active edges 25c–25e and 26c–26e occur during "1" states of the corresponding input signals, such that the outputs ($OUT_1$ and $OUT_2$) of the two D flip-flops 15 and 16 toggle. This, in turn, results in three short interval pulses 28, 29 and 30 in the output pulse sequence.

However, the circuit of FIG. 3 cannot only be used to generate the shown short-interval pulses, as explained up to now. For example, reference number 31 relates to a broader pulse caused by a state change of one input signal ($IN_1$, see reference number 32), whereas the corresponding input signal $IN_2$ is 0 (reference number 33). In similar manner, a short "negative" pulse 34 may be generated, or the output level of the circuit may be changed to "1", as indicated by 35. This illustrates the broad flexibility of the inventive formatter circuit.

The circuits of FIGS. 1 and 3 used a combination of EXOR gates and D flip-flops to implement an edge-triggered D flip-flop. However, other types of flip-flops may be used as well. For example, FIG. 5 depicts a JK flip-flop 36 which receives the input data signal IN (line 37) at its J as well as its K input. The clock or edge generator signal is fed via line 38 to its clock input. JK flip-flop 36 further comprises a "Set" input (line 39) and a "Reset" input (line 40). The Set/Reset inputs are required to establish a defined state of the flip-flop before operation starts. Its Q output generates the pulse sequence OUT (line 41) which is fed to a pin of the device under test.

The timing diagram of FIG. 6 depicts the clock (CLK) input on line 38 (FIG. 6a), the data input IN on line 37 (FIG. 6b) and the Q output of the JK flip-flop on line 41 (FIG. 6c). It will be noted that the clock signal provides active positive transitions (reference number 42a) as well as negative active transitions (reference number 43a). This is because JK flip-flop 36 is an edge-triggered master-slave-flip-flop; that is, the information at its inputs is fed to the master flip-flop upon a positive clock transition, and is fed from the master flip-flop to the slave flip-flop and thus to the output of the whole flip-flop at a negative transition of the clock signal.

This is illustrated by FIG. 6. Upon the positive transition 42b of the clock signal, the Q output of JK flip-flop 36 does *not* change its state although the input signal IN is "1" (reference number 44). This is because, upon positive transition 42b, the input signal is fed into the master flip-flop, but not into the slave flip-flop. However, upon occurrence of a negative transition 43b, the Q output changes its state to "1" (reference number 45) at $t=t_1$. It will be observed that JK flip-flop 36 performs the same operation as the circuit in FIG. 1 (cf. particularly FIGS. 6c and 2c), apart from the 180° phase shift caused by the master-slave design of the JK flip-flop.

A JK flip-flop may even be used in a formatter circuit of the present invention in case it provides no separate "Set" or "Reset" inputs. The "Set" and "Reset" signals can be combined with an input signal IN if the J and K inputs incorporate the following Boolean equations:

$$J = S + I \cdot \overline{R} \tag{6}$$

$$K = R + I \cdot \overline{S} \tag{7}$$

The corresponding circuit is shown in FIG. 7. "S" is the Set signal and "R" is the Reset signal. Gates 46, 47, 48 and 49 implement the functions given above in equations (5) and (6). It will be noted that JK flip-flop 50 does not provide a "Set" or "Reset" input.

It will be appreciated that the basic cell of FIG. 5 with a JK flip-flop may be cascaded with EXOR gates in similar manner as shown in FIG. 3.

The layout of an integrated formatter circuit using a multiplicity of toggle flip-flops is shown in FIG. 8. All of cells 51–56 constitute T flip-flops (e.g. their internal structure corresponds to the circuit of FIG. 1). However, the cells in FIG. 8 use a differential design, i.e. provide differential inputs and outputs.

With reference to cell 51, the data input signal is provided on line 57, and its complement on line 58. Its Q output (line 59) is fed to the D0 input and to the inverted D1 input; likewise, its inverted Q output (QN) is fed on line 60 to the D1 input and the inverted D0 input. The clock signal (from an edge generator) is received on line 61, and the inverted clock signal on line 62. A "Set" signal is received on line 63 and a "Reset" signal on line 64.

Cells 52–56 have the same structure. The outputs of D flip-flops 51 and 52 are combined, also in a differential design, in EXOR gate 65. In similar manner, the outputs of D flip-flops 53 and 54 are combined in EXOR gate 66, and the outputs of D flip-flops 55 and 56 are combined in EXOR gate 67. EXOR gates 65, 66 and 67 constitute a first level of output EXOR gates.

The second level of EXOR gates consists of EXOR gate 68 which combines the outputs of EXOR gates 65 and 66. Similarly, EXOR gate 69 constitutes the third level of EXOR gates and combines the outputs of EXOR gate 68 (second level) and EXOR gate 67 (first level). The output of EXOR gate 69 constitutes the signal to be fed to a pin of a device under test, wherein line 70 carries the output signal and line 71 its complement.

Application of the new formatter circuit in an integrated circuit tester is shown in FIG. 9. For the purpose of a simple explanation, a single "basic cell", i.e. a single toggle flip-flop constituted of EXOR gate 72 and D flip-flop 73, has been selected. However, it will be understood that more complex structures such as in FIG. 8 would be used in a commercial integrated circuit tester.

A sequencer 74 generates subsequent address signals and feeds them—via n lines 75—to the address inputs of a vector memory 76. The vector memory contains information on actions to be performed at a pin of the device under test. The data outputs of vector memory 76—reference number 77—constitute the address inputs of a waveform memory 78 which decodes the actions into control signals for the various formatter circuits (such as a data formatter and a tri-state formatter), or into control information for receiver circuitry such as a comparator or a window formatter.

In the shown example, a single control signal, which is the data input signal for EXOR gate 72, is generated on line 79. However, it will be understood that, in commercial integrated circuit testers, a multiplicity (typically 70) of such control signals is generated by waveform memory 78.

Reference number 80 relates to an edge generator which is connected with the clock input of D flip-flop 73.

I claim:

1. A formatter circuit for an integrated circuit tester receiving at least two data signals, at least two timing signals, and providing at least one pulse sequence for application to at least one pin of a device under test, said formatter circuit comprising:
   at least two edge-triggered, toggle flip-flop means, each said toggle flip-flop means having a clock input, a data input and an output, wherein said timing signals are fed to clock inputs of each said toggle flip-flop means respectively and said data signals are fed to data inputs of each said toggle flip-flop means respectively, each said toggle flip flop means (i) inverting a level on said output in response to a first direction edge transition of a said timing signal when said data input is in a true state and (ii) maintaining unchanged a level on its output when said data input is in a false state, irrespective of edge transitions of a said timing signal, and wherein outputs of said toggle flip-flop means are fed to inputs of EXOR circuitry.

2. A formatter circuit according to claim 1, wherein at least two said toggle flip-flop means receive different data and/or timing signals.

3. A formatter circuit according to claim 1, wherein each said toggle flip-flop means includes an edge-triggered D flip-flop and further comprising:
   an EXOR circuit having an output connected to a D input of said D flip-flop, an output of said D flip flop fed back to one input of said EXOR circuit, a second input of said EXOR circuit receiving said data signal.

4. A formatter circuit according to claim 1, wherein each said toggle flip-flop means comprises a JK flip-flop, said data signal fed to a J as well as a K input of said JK flip-flop.

5. A formatter circuit according to claim 1 wherein said EXOR circuitry comprises at least two levels of EXOR circuits, and outputs of said toggle flip-flop means are connected with inputs of EXOR circuits of a first level, and at least some outputs of the EXOR circuits of said first level are connected with the inputs of EXOR circuits of a second level.

6. A formatter circuit according to claim 5 wherein said EXOR circuitry comprises more than 2 levels of EXOR circuits, and wherein an output of at least one EXOR circuit of a lower level is connected with an input of an EXOR circuit which is at least two levels higher.

7. A formatter circuit according to claim 1, wherein each said toggle flip-flop means responds to applied differential inputs and provides differential outputs.

8. A formatter circuit according to claim 1, wherein said at least one data signal is derived from a memory, said memory being a waveform memory containing waveform data and operating under control of a vector memory.

9. A method for formatting data in an integrated circuit tester, comprising the steps of:
   feeding at least two data signals to data inputs of at least two edge-triggered, toggle flip-flops each said toggle flip-flop having a timing signal input, a data signal input and an output and (i) inverting a level on said output in response to a first sense edge transition of a timing signal when a data signal input manifests a true state and (ii) maintaining unchanged a level on said output when said data signal input manifests a false state, irrespective of edge transitions of a timing signal on said timing signal input; and
   feeding at least two timing signals to clock inputs of said edge-triggered toggle flip-flops; and feeding outputs of said toggle flip-flops to inputs of EXOR circuitry.

* * * * *